United States Patent
Horng et al.

(10) Patent No.: US 7,134,186 B2
(45) Date of Patent: Nov. 14, 2006

(54) METHOD FOR FABRICATING A PATTERNED, SYNTHETIC TRANSVERSELY EXCHANGED BIASED GMR SENSOR

(75) Inventors: Cheng T. Horng, San Jose, CA (US); Min Li, Fremont, CA (US); Ru-Ying Tong, San Jose, CA (US); Yun-Fei Li, Fremont, CA (US); You Fong Zheng, San Jose, CA (US); Simon Liao, Fremont, CA (US); Kochan Ju, Fremont, CA (US); Cherng Chyi Han, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 142 days.

(21) Appl. No.: 11/036,922

(22) Filed: Jan. 14, 2005

(65) Prior Publication Data
US 2005/0122638 A1    Jun. 9, 2005

Related U.S. Application Data

(62) Division of application No. 10/104,802, filed on Mar. 22, 2002, now Pat. No. 6,857,180.

(51) Int. Cl.
*G11B 5/127* (2006.01)
*H04R 31/00* (2006.01)

(52) U.S. Cl. ............... 29/603.14; 29/603.08; 29/603.15; 360/324.1; 360/324.2; 360/324.11; 360/324.12; 427/127; 427/128; 216/22

(58) Field of Classification Search ............ 29/603.08, 29/603.14, 603.15; 360/324.1, 324, 324.11; 427/127–131; 216/22
See application file for complete search history.

(56) References Cited

U.S. PATENT DOCUMENTS

| 6,222,707 | B1 |   | 4/2001  | Huai et al.      | 360/324.1  |
|-----------|----|---|---------|------------------|------------|
| 6,313,973 | B1 |   | 11/2001 | Fuke et al.      | 360/324.1  |
| 6,322,640 | B1 |   | 11/2001 | Xiao et al.      | 148/308    |
| 6,322,911 | B1 |   | 11/2001 | Fukagawa et al.  | 428/692    |
| 6,324,037 | B1 |   | 11/2001 | Zhu et al.       | 360/324.12 |
| 6,714,387 | B1 | * | 3/2004  | Horng et al.     | 360/320    |
| 6,747,852 | B1 | * | 6/2004  | Lin et al.       | 360/324.12 |
| 6,842,969 | B1 |   | 1/2005  | Dovek et al.     | 29/603.14  |
| 6,961,225 | B1 | * | 11/2005 | Gill             | 360/324.12 |

OTHER PUBLICATIONS

Co-pending U.S. Appl. No. 10/091,959, filed Mar. 6, 2002, "Easily Manufactured Exchange Bias Stabilization Scheme", assigned to the same assignee as the present invention.
Co-pending U.S. Appl. No. 10/077,064, filed Feb. 15, 2002, "Synthetic Pattern Exchange Configuration for Side Reading Reduction", assigned to the same assignee as the present invention.

* cited by examiner

*Primary Examiner*—Paul D. Kim
(74) *Attorney, Agent, or Firm*—Saile Ackerman LLC; Stephen B. Ackerman (57) ABSTRACT

Patterned, longitudinally and transversely antiferromagnetically exchange biased GMR sensors are provided which have narrow effective trackwidths and reduced side reading. The exchange biasing significantly reduces signals produced by the portion of the ferromagnetic free layer that is underneath the conducting leads while still providing a strong pinning field to maintain sensor stability. In the case of the transversely biased sensor, the magnetization of the free and biasing layers in the same direction as the pinned layer simplifies the fabrication process and permits the formation of thinner leads by eliminating the necessity for current shunting.

7 Claims, 7 Drawing Sheets

METHOD FOR FABRICATING A PATTERNED, SYNTHETIC TRANSVERSELY EXCHANGED BIASED GMR SENSOR

This is a division of patent application Ser. No. 10/104,802, filing date Mar. 22, 2002, now U.S. Pat. No. 6,857,180, Transverse Or Longitudinal Patterned Synthetic Exchange Biasing For Stabilizing Gmr Sensors, assigned to the same assignee as the present invention, which is herein incorporated by reference in its entirety.

RELATED PATENT APPLICATION

This application is related to Ser. No. 10/091,959 filing date Mar. 6, 2002, now U.S. Pat. No. 7,035,060, Ser. No. 10/077,064, filing date Feb. 15, 2002, now U.S. Pat. No. 7,010,848, and Ser. No. 10/116,984, filing date Apr. 15, 2002, now U.S. Pat. No. 6,842,969, assigned to the same assignee as the current invention.

BACKGROUND OF THE INVENTION

1. Field of the Invention

This invention relates generally to the fabrication of a giant magnetoresistive (GMR) magnetic field sensor for a magnetic read head, more specifically to the use of either transverse or longitudinal synthetic exchange biasing to stabilize, suppress side reading and reduce the magnetic track width (MRW) of such a sensor.

2. Description of the Related Art

Magnetic read heads whose sensors make use of the giant magnetoresistive effect (GMR) in the spin-valve configuration (SVMR) base their operation on the fact that magnetic fields produced by data stored in the medium being read cause the direction of the magnetization of one layer in the sensor (the free magnetic layer) to move relative to a fixed magnetization direction of another layer of the sensor (the fixed or pinned magnetic layer). Because the resistance of the sensor element is proportional to the cosine of the (varying) angle between these two magnetizations, a constant current (the sensing current) passing through the sensor produces a varying voltage across the sensor which is interpreted by associated electronic circuitry. The accuracy, linearity and stability required of a GMR sensor places stringent requirements on the magnetization of its fixed and free magnetic layers. The fixed layer, for example, has its magnetization "pinned" in a direction normal to the air bearing surface of the sensor (the transverse direction) by an adjacent magnetic layer (typically an antiferromagnetic layer) called the pinning layer. The free layer is typically magnetized in a direction along the width of the sensor and parallel to the air bearing surface (the longitudinal direction). Layers of hard magnetic material (permanent magnetic layers) or laminates of antiferromagnetic and soft magnetic materials are typically formed on each side of the sensor and oriented so that their magnetic field extends in the same direction as that of the free layer. These layers, called longitudinal bias layers, maintain the free layer as a single magnetic domain and also assist in linearizing the sensor response by keeping the free layer magnetization direction normal to that of the fixed layer when quiescent. Maintaining the free layer in a single domain state significantly reduces noise (Barkhausen noise) in the signal produced by thermodynamic variations in domain configurations. A magnetically stable spin-valve sensor using either hard magnetic biasing layers or ferromagnetic biasing layers is disclosed by Zhu et al. (U.S. Pat. No. 6,324,037 B1) and by Huai et al. (U.S. Pat. No. 6,222,707 B1).

The importance of longitudinal bias has led to various inventions designed to improve the material composition, structure, positioning and method of forming the magnetic layers that produce it. One form of the prior art provides for sensor structures in which the longitudinal bias layers are layers of hard magnetic material (permanent magnets) that abut the etched back ends of the active region of the sensor to produce what is called an abutted junction configuration. This arrangement fixes the domain structure of the free magnetic layer by magnetostatic coupling through direct edge-to-edge contact at the etched junction between the biasing layer and the exposed end of the layer being biased (the free layer). Another form of the present art employs patterned direct exchange bias. Unlike the magnetostatic coupling resulting from direct contact with a hard magnetic material that is used in the abutted junction, in exchange coupling the biasing layer is a layer of ferromagnetic material which overlays the layer being biased, but is separated from it by a thin coupling layer of conducting, but non-magnetic material. This non-magnetic gap separating the two layers produces exchange coupling between them, a situation in which it is energetically favorable for the biasing layer and the biased layer assume a certain relative direction of magnetization. Another form of exchange coupling involves a direct contact between the free ferromagnetic layer and an overlaying layer of antiferromagnetic material. Xiao et al. (U.S. Pat. No. 6,322,640 B1) disclose a method for forming a double, antiferromagnetically biased GMR sensor, using as the biasing material a magnetic material having two crystalline phases, one of which couples antiferromagnetically and the other of which does not. Fuke et al. (U.S. Pat. No. 6,313,973 B1) provides an exchange coupled configuration comprising a coupling film, an antiferromagnetic film and a ferromagnetic film and wherein the coupling film has a particularly advantageous crystal structure.

As the area density of magnetization in magnetic recording media (eg. disks) continues to increase, significant reduction in the width of the active sensing region (trackwidth) of read-sensors becomes necessary. For trackwidths less than 0.2 microns (μm), the traditional abutted junction hard bias structure discussed above becomes unsuitable because the strong magnetostatic coupling at the junction surface actually pins the magnetization of the (very narrow) biased layer (the free layer), making it less responsive to the signal being read and, thereby, significantly reducing the sensor sensitivity.

Figure 1:
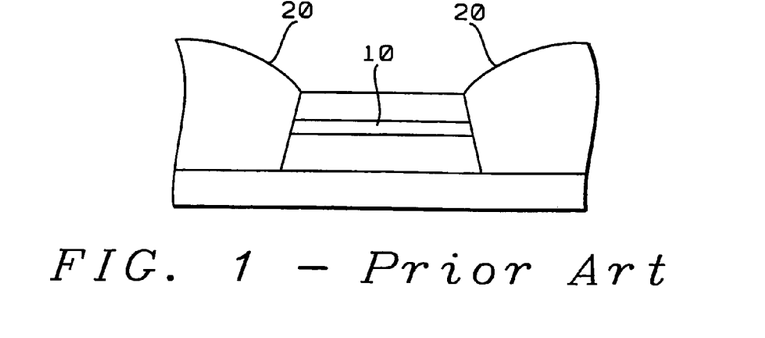
FIG. 1 is a highly schematic diagram of a prior-art abutted junction GMR sensor stack having a hard magnetic longitudinal bias layer and conductive lead overlayer in contact with the junction. The diagram is a cross-sectional view of the air bearing surface (ABS) of the sensor. The sensor stack shows only the free layer.
Figure 2:
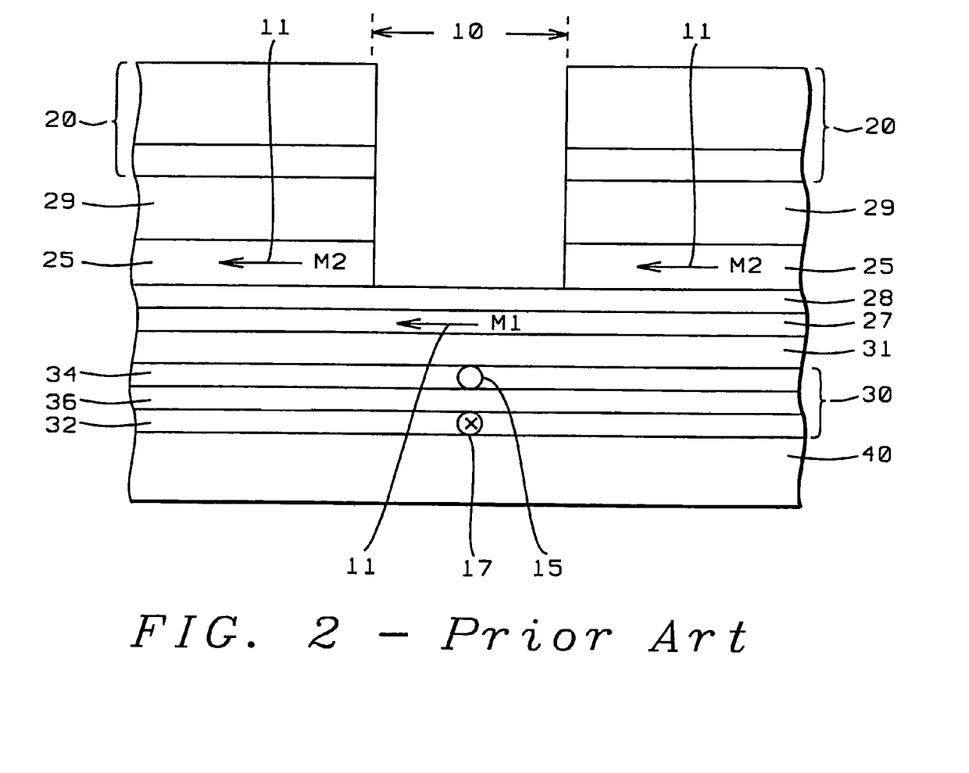
FIG. 2 is a schematic, ABS view, cross-sectional diagram of a prior-art direct exchange (longitudinally) biased GMR sensor stack, showing the patterned biasing layers, their magnetization directions, and other layers of the sensor.

Under very narrow trackwidth conditions, the exchange bias method becomes increasingly attractive, since the free layer is not reduced in size by the formation of an abutted junction, but extends continuously across the entire width of the sensor element. FIG. 1 is a schematic depiction of an abutted junction arrangement and FIG. 2 is an equally schematic depiction of a direct exchange coupled configuration. As can be seen, the trackwidth in the abutted junction is made narrow by physically etching away both ends of the sensor, whereas in the exchange coupled sensor, the trackwidth is defined by placement of the conductive leads and bias layers while the sensor element retains its full width.

The direct exchange biasing-also has disadvantages when used in a very narrow trackwidth configuration because of the weakness of the pinning field, which is found to be, typically, approximately 250 Oe. The present invention will address this weak pinning field problem while retaining the advantages of exchange biasing by providing a new exchange biased configuration, synthetic exchange biasing. In this configuration, the biasing layer is exchange coupled to the free layer by antiferromagnetic exchange coupling, in which the ferromagnetic biasing layer and the ferromagnetic free layer are coupled by a non-magnetic layer to form a configuration in which the two layers have antiparallel magnetizations (a synthetic antiferromagnetic layer). A stronger pinning field, typically exceeding 700 Oe, can be obtained using the synthetic exchange biasing method. More advantageously, an effective magnetic trackwidth of 0.15 μm can be obtained with a physical track width of 0.1 μm by using such a configuration by reducing the level of side reading (sensor response generated by signals originating outside of the magnetic trackwidth region) which is produced by the portion of the free layer that is beneath the biasing layer and conduction leads. The invention provides such a novel synthetic exchange biased sensor in two configurations, longitudinal and transverse, each of which is shown to have particular advantages both in its operation and its formation.

SUMMARY OF THE INVENTION

It is a first object of the present invention to provide a magnetically stable patterned synthetic exchange biased GMR sensor capable of reading high area density magnetic recordings of densities exceeding 60 Gb/in$^2$ (gigabits per square inch).

It is a second object of the present invention to provide such a patterned synthetic exchange biased GMR sensor which is biased in either the longitudinal or the transverse directions.

It is a third object of the present invention to provide such a synthetic exchange biased GMR sensor having a very narrow effective magnetic trackwidth in which undesirable side reading is significantly reduced.

It is a fourth object of the present invention to provide such a synthetic exchange biased GMR sensor that is easily fabricated.

It is a fifth object of the present invention to provide such a synthetic exchange biased GMR sensor that has thin conducting lead layers for an improved topography.

The objects of this invention will be achieved in three embodiments, each of which will now be briefly described and will then be described in fuller detail below. In the first embodiment, a synthetic exchange longitudinally biased GMR sensor will be provided, said sensor having a bottom spin valve, specularly reflecting structure which can be deposited in a single fabrication process and which has the following structural form:

NiCr/MnPt/CoFe(AP2)/Ru/CoFe(AP1)/Cu/CoFe—NiFe/Ru/CoFe/IrMn/Ta/Au

The NiCr is a seed layer, the MnPt is an antiferromagnetic pinning layer for the bottom synthetic pinned layer of CoFe (AP2)/Ru/CoFe(AP1), wherein the two ferromagnetic exchange coupled CoFe layers are labeled AP1 & AP2 to distinguish them. The Cu layer is a conducting, non-magnetic spacer layer separating the synthetic pinned layer from the CoFe—NiFe ferromagnetic free layer (a bilayer). This latter bilayer is antiferromagnetically-exchange-coupled across a Ru layer to a (patterned) CoFe biasing layer, forming the synthetic exchange coupled bias structure which has both a high pinning field and advantageous magnetostriction characteristics. The exchange biased layer is itself antiferromagnetically pinned by direct exchange coupling with an antiferromagnetic IrMn layer, over which is a conductive lead layer of Ta/Au. It is found that the pinning field of the free layer provided by the patterned bias layer in this synthetic exchange coupled configuration exceeds 650 Oe and may be as high as 755 Oe, as compared to pinning fields of the order of 250–300 Oe for the direct (not synthetic) coupled structure.

In the second embodiment, a synthetic exchange transversely biased GMR sensor will be provided together with a method for its fabrication. The structural form of this embodiment is:

NiCr/AFM/CoFe(AP2)/Ru/CoFe(AP1)/Cu/CoFe—NiFe/Ru/CoFe/AFM/Ta/Au.

The NiCr is a seed layer, AFM denotes an antiferromagnetic pinning layer for the bottom synthetic pinned layer of CoFe (AP2)/Ru/CoFe(AP1), wherein the two ferromagnetic exchange coupled CoFe layers are labeled AP1 & AP2 to distinguish them. The Cu layer is a conducting, non-magnetic spacer layer separating the synthetic pinned layer from the CoFe—NiFe ferromagnetic free layer (a bilayer). This latter bilayer is antiferromagnetically exchange coupled across a Ru layer to a (patterned) CoFe biasing layer, forming the synthetic exchange coupled bias structure. The exchange biased layer is itself antiferromagnetically pinned by direct exchange coupling with an antiferromagnetic layer, again denoted AFM, over which is a conductive lead layer of Ta/Au. In contrast to the structural form of the first embodiment, the same antiferromagnetic material, typically either IrMn or MnPt, can serve in both locations designated AFM. An important advantage of the transverse biasing is that the magnetic field of the free and pinned layers are in the same direction, producing a plateau region under low external field wherein the free layer magnetization and the pinned layer magnetizations do not rotate relative to each other. This is particularly important for reducing signal contributions from the free layer region that is under the biasing layer which then produces a narrow effective trackwidth.

It is another one of the advantages of this second embodiment that different antiferromagnetic materials are not necessary to achieve its objects because both the synthetic pinned layer, CoFe (AP2)/Ru/CoFe(AP1), and the synthetic bias exchange coupled free layer, CoFe—NiFe/Ru/CoFe, are magnetized along the same direction. This allows antiferromagnetic materials with high blocking temperatures to be utilized which, in turn, allows high pinning fields to be obtained. The high pinning fields minimizes the problems caused by sensor current flow within the sensor element and, consequently, current shunting is not required and thin conducting lead layers can be used. The third embodiment of the present invention provides a transversely biased sensor as in the second embodiment, but the pinning fields at opposite ends of the free layer are antiparallel to each other. This configuration affords the additional advantages of stabilizing the bias point of the free layer and further minimizing side reading by the sensor. In the description of the three embodiments provided below, the structures, the processes preferred for their fabrication and their advantages, will be more fully described.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying figures, wherein:

FIG. 3b shows the process of patterning the sensor of FIG. 3a.

DESCRIPTION OF THE PREFERRED EMBODIMENTS

Referring first to FIG. 1 there is shown a schematic cross-sectional view of the ABS surface of a typical abutted junction GMR sensor designed in accord with the prior art. As can be seen, the narrow trackwidth is obtained at the price of reducing the physical width of the ferromagnetic free layer (10). As a result, the biasing layer (25) pins the magnetization of the free layer and reduces the sensitivity of the sensor.

Referring next to FIG. 2, there is shown a schematic cross-sectional view of the ABS surface of a patterned direct exchange longitudinally biased GMR sensor of the prior art. The physical trackwidth (10) of this configuration is defined by the width of the region between the leads (20), typically a Ta/Au bilayer, and the patterned biasing layers beneath them (25), typically layers of CoFe: The ferromagnetic free layer (27), typically a CoFe/NiFe bilayer, extends the entire width of the sensor so it is not adversely affected by the edge pinning field of the biasing layer, which is a disadvantage of the hard biased abutted junction of FIG. 1. The diagram also shows the antiferromagnetic layer (29), typically a layer of IrMn, which pins the patterned biasing layer (25). The free layer (27) is separated from the biasing layer (25) by a non-magnetic coupling layer (28) which is typically a layer of Cu or Ru and which directly exchange couples the ferromagnetic free layer (27) to the ferromagnetic biasing layer (25) by ferromagnetic coupling to produce parallel magnetizations (11) labeled M2 (biasing layer) and M1 (free layer). The remainder of the configuration comprises an antiferromagnetically coupled (synthetic) pinned layer (30), which comprises two ferromagnetic layers ((32) and (34)) antiferromagnetically exchange coupled across a non-magnetic coupling layer (36) and which is separated from (27) by a non magnetic spacer layer (31). Beneath (30) there is an antiferromagnetic pinning layer (40), typically a layer of MnPt, which pins the antiferromagnetically coupled pinned layer. The magnetic moments of the antiferromagnetically coupled pinned layers are in the transverse direction (perpendicular to the plane of the figure) and are antiparallel, with the directions of magnetization of the individual layers indicated by circles (15) (out of the plane) and crosses within circles (17) (into the plane). Obtaining perpendicularity of the free layer magnetization and pinned layer magnetization complicates the fabrication process of the sensor, since two different antiferromagnetic materials with different blocking temperatures are typically required for (40) and (29), eg. IrMn and MnPt in this illustration, as are different annealing schedules so that the magnetization of the pinned layer should not affect the magnetization of the biasing layer. When the physical trackwidth (10) of this entire configuration is narrow, however, (less than 0.2 microns) the strength of the ferromagnetic coupling (the pinning field) is weak and is typically less than 250 Oe. Note that thicknesses are not given for this figure since the configuration is shown for comparison purposes only.

First Preferred Embodiment

Figure 3A:
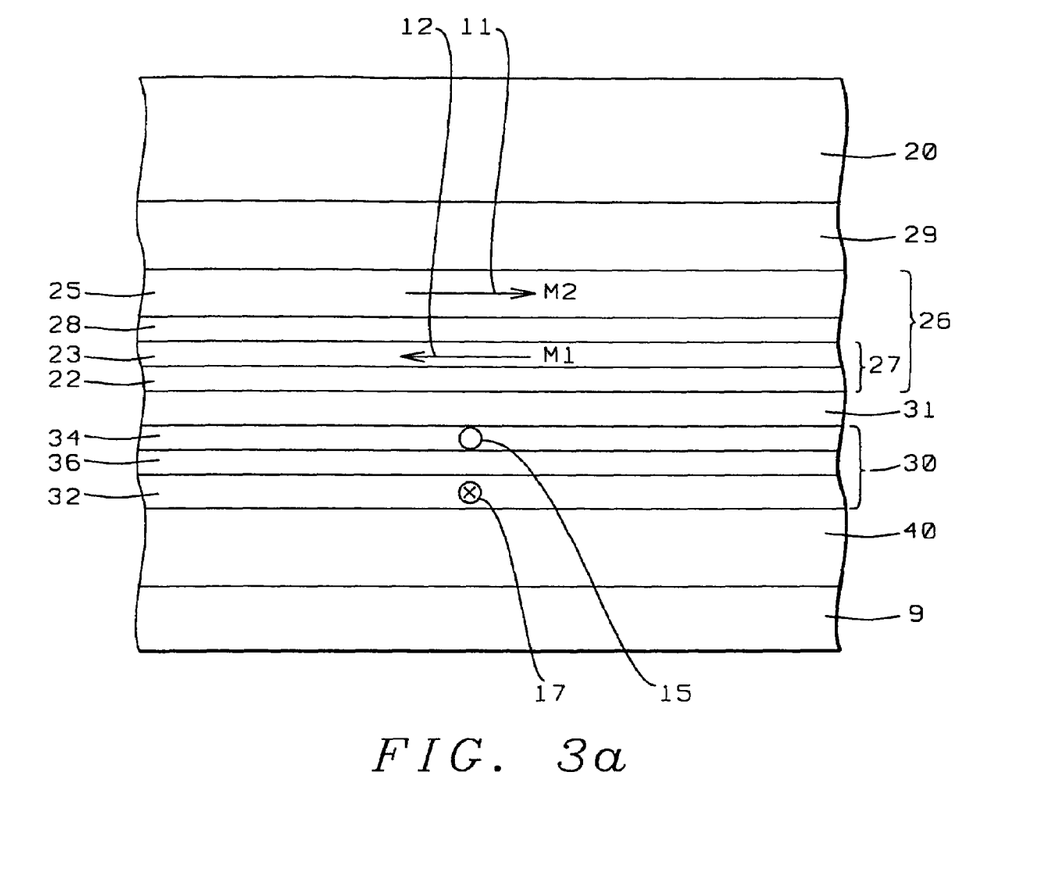
FIG. 3a is a schematic, ABS view, cross-sectional diagram of a synthetic exchange (longitudinally) biased GMR sensor stack, before patterning, fabricated in accord with the objects of the first preferred embodiment of the present invention.

Referring next to FIG. 3a, there is shown a schematic cross-sectional view of the air bearing surface (ABS) of a synthetic exchange longitudinally biased GMR sensor, before patterning, fabricated in accord with the objects of a first embodiment of the present invention and having the properties and advantages of said embodiment. The device is fabricated in a sequence of three major steps: 1) depositing the sensor layers; 2) annealing and magnetizing the synthetic pinned layer and the synthetic biased free layer; 3) patterning.

1) Deposition Process

First there is deposited a seed layer (9), which is typically a layer of NiCr deposited to a thickness of between approximately 55 and 65 angstroms with 60 angstroms being preferred. On this seed layer is then deposited a first antiferromagnetic layer (40) to serve as a pinning layer. Typically this pinning layer is a layer of MnPt deposited to a thickness of between approximately 80 and 150 angstroms with 100 angstroms being preferred. On the pinning layer, and pinned by it, there is then formed a synthetic antiferromagnetic pinned layer (30), which is an antiferromagnetically coupled trilayer comprising a first ferromagnetic layer (32), a first non-magnetic antiferromagnetically coupling layer (36) formed on (32) and a second ferromagnetic layer (34) formed on the coupling layer. The ferromagnetic layers are typically layers of CoFe, with the first layer having a thickness of between approximately 12 and 20 angstroms with 15 angstroms being preferred and the second layer having a thickness of between approximately 15 and 25 angstroms with 20 angstroms being preferred. The coupling layer, which is typically a layer of Ru, is formed to a thickness of between approximately 7 and 9 angstroms with 7.5 angstroms being preferred. On the synthetic pinned layer is then formed a non-magnetic spacer layer (31), which separates the pinned and free layers. This spacer layer is typically a layer of Cu, which is formed to a thickness of between approximately 13 and 25 angstroms with 18 angstroms being preferred. The free layer (27), which is a ferromagnetic bilayer of CoFe (22) and NiFe (23), is then formed on the spacer layer, wherein the CoFe layer has a thickness of between approximately 5 and 15 with 10 angstroms being preferred and the NiFe layer has a thickness of between approximately 15 and 30 angstroms with 20 angstroms being preferred. The free layer is then antiferromagnetically exchange coupled across a non-magnetic coupling layer (28) to a ferromagnetic biasing layer (25), forming, thereby, the synthetic exchange biased configuration (26). The coupling layer in this case is a layer of Ru of thickness between approximately 7 and 9 angstroms with 7.5 angstroms being preferred and the biasing layer is a layer of CoFe of thickness between approximately 10 and 25 angstroms with 15 angstroms being preferred. The synthetic exchange biased configuration (26) is then pinned by an antiferromagnetic layer of IrMn (29) of thickness between approximately 35 and 55 angstroms with 40 angstroms being preferred. A conducting lead layer (20) is deposited over the IrMn layer in a lead overlay (LOL) configuration. The lead layer is typically a Ta/Au bilayer of thickness between approximately 100 and 500 angstroms.

2) Annealing Process

The GMR sensor configuration thus formed is then given a first pinned layer annealing to fix the magnetizations of both synthetic pinned layers (30) & (26). The anneal consists of a 5 hour 280° C. anneal in an external transversely directed magnetic field of approximately 10 kOe (kilooersteds) to set both pinned layers in the transverse direction (perpendicular to the air-bearing surface). The resulting magnetization vectors are shown only for the first pinned layer (30) as a circle (15), representing a direction out of the plane, and a circle with an interior cross (17), representing a direction into the plane. Following this first pinned layer anneal, a second anneal is applied at a lower temperature and lower magnetic field to reset the magnetization of the synthetic exchange biased layer (26) from the transverse direction into the longitudinal direction. This second anneal is carried out for a time of approximately 30 minutes at an annealing temperature of approximately 250° C., which is higher than the IrMn blocking temperature. The resulting magnetizations are shown as arrows, M1 (12) being the magnetization of the free layer and M2 (11) that of the biasing layer. Under this anneal, the synthetic pinned layer (30) retains its transverse magnetization. It is found by experiment that the configuration described above, under the sequence of anneals to which it is subjected as is also described above, has the advantageous properties of a high pinning field that is approximately 755 Oe, as well as a desirable value of free layer magnetostriction.

3) Patterning Process

Figure 3B:
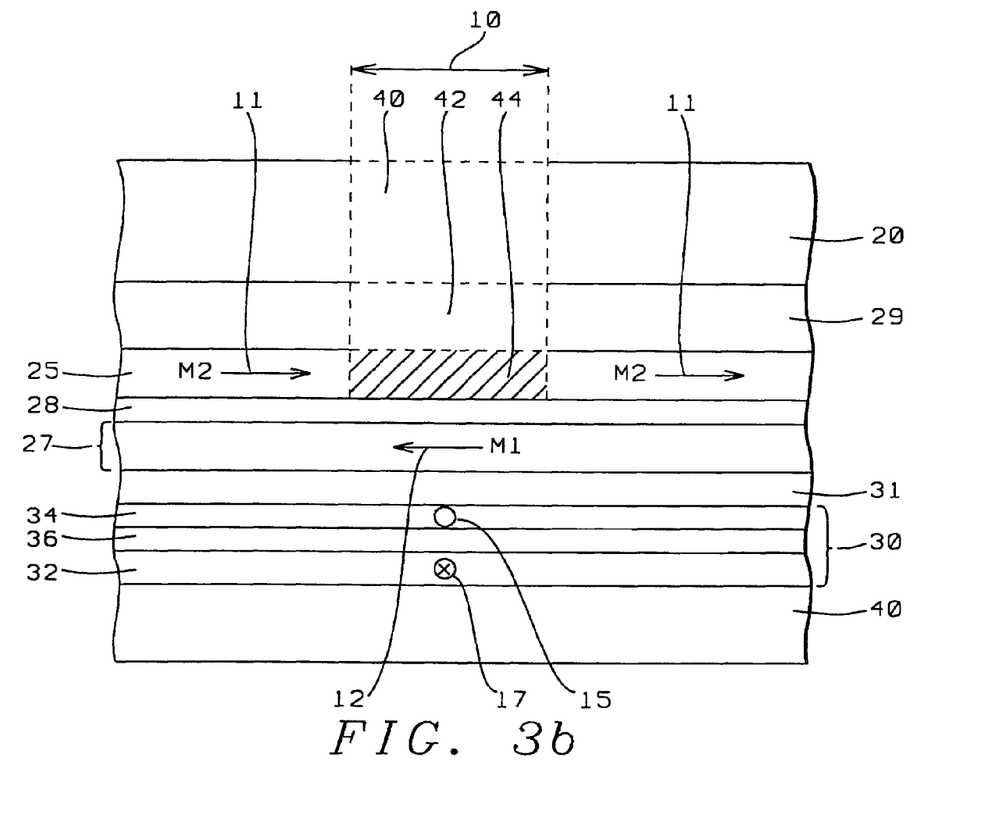

Referring now to FIG. 3b, there is shown a schematic diagram illustrating the process by which a physical trackwidth (10) of approximately 0.1 microns is formed in the sensor of FIG. 3a by etching the lead and pinning layers to form the patterned exchange structure. Patterning is done by sequentially removing the entire thickness of a lateral portion of the lead layer (40) (shown in dashed outline) and the entire thickness of the IrMn pinning layer beneath it (42) (shown in dashed outline) by use of a reactive ion etch (RIE) or an ion beam etch (IBE). Removal of these two layers exposes a portion of the CoFe biasing layer (44), said portion then being effectively removed by an oxidation process, which converts it to a non-magnetic CoFeO (shown shaded). In this process, the antiferromagnetically coupling layer (28) of Ru acts as an oxidation barrier to prevent the oxidation from extending downward to adversely affect the ferromagnetic free layer (27). The surface of the coupling layer (28) beneath (44) is thereby itself oxidized at the termination of the process. Note in the synthetic pinned layer (30) that small circles (15) represent magnetizations out of the plane, circles with interior crosses (17) are into the plane. The symbols M1 (12) and M2 (11) refer to the antiparallel directions of the magnetizations of the free (M1) and pinning (M2) layers.

Second Preferred Embodiment

Figure 4A:
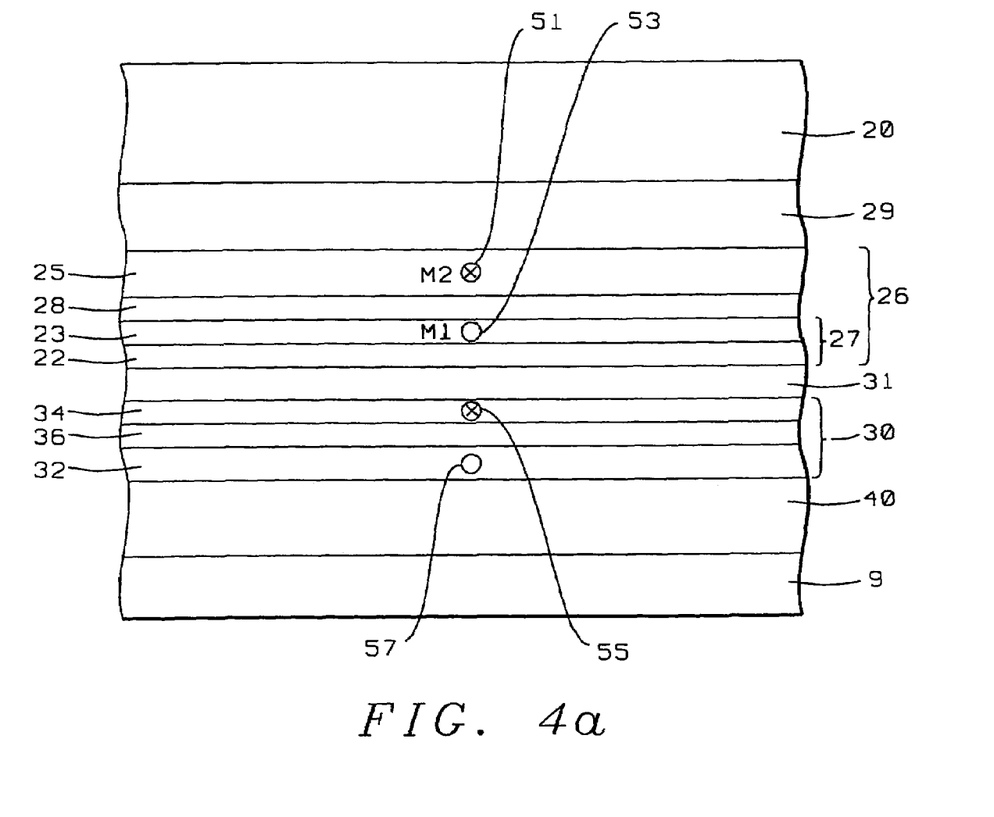
FIG. 4a is a schematic, ABS view, cross-sectional diagram of a synthetic exchange biased GMR sensor stack formed in accord with a second embodiment of the present invention. The transverse magnetizations of the exchange biased free layer and the synthetic pinned layer are indicated.

Referring next to FIG. 4a, there is shown a schematic cross-sectional view of the air bearing surface (ABS) of a synthetic exchange transversely biased GMR sensor, before patterning, fabricated in accord with the objects of a second embodiment of the present invention and having the properties and advantages of said embodiment. The device is fabricated in a sequence of three major steps: 1) depositing the sensor layers; 2) annealing and magnetizing the synthetic pinned layer and the synthetic biased free layer; 3) patterning.

1) Deposition Process

First there is deposited a seed layer (9), which is typically a layer of NiCr deposited to a thickness of between approximately 50 and 60 angstroms. On this seed layer is then deposited a first antiferromagnetic layer (40) to serve as a pinning layer. Typically this pinning layer is a layer of MnPt deposited to a thickness of between approximately 100 and 150 angstroms, but other antiferromagnetic materials such as NiMn, PdPtMn, FeMn or IrMn can be used. On the first pinning layer, and to be pinned by it, there is then formed a synthetic antiferromagnetic pinned layer (30), which is an antiferromagnetically coupled trilayer comprising a first ferromagnetic layer (32), a first non-magnetic antiferromagnetically coupling layer (36) formed on (32) and a second ferromagnetic layer (34) formed on the coupling layer. The ferromagnetic layers are typically layers of CoFe, with the first ferromagnetic layer having a thickness of between approximately 15 and 20 angstroms with 15 angstroms being preferred and the second ferromagnetic layer having a thickness of between approximately 20 and 25 angstroms with 20 angstroms being preferred. The first coupling layer, which can be a layer of Ru, is formed to a thickness of between approximately 7 and 9 angstroms with 7.5 angstroms being preferred. Alternatively, the first coupling layer can be a layer of Rh, formed to a thickness of between 4 and 6 angstroms with 5 angstroms being preferred. On the synthetic antiferromagnetic pinned layer there is then formed a non-magnetic spacer layer (31), which separates the pinned and free layers. This spacer layer is typically a layer of Cu, which is formed to a thickness of between approximately 15 and 22 angstroms with 18 angstroms being preferred. The free layer (27), which is preferably a ferromagnetic bilayer of CoFe (22) and NiFe (23), is then formed on the spacer layer, wherein the CoFe layer has a thickness of between approximately 5 and 15 with 10 angstroms being preferred and the NiFe layer has a thickness of between approximately 15 and 30 angstroms with 20 angstroms being preferred. The free layer is then antiferromagnetically exchange coupled across a second non-magnetic coupling layer (28) to a ferromagnetic biasing layer (25), forming, thereby, the synthetic exchange biased configuration (26). If the first non-magnetic coupling layer (36) is a layer of Ru, then the second non-magnetic coupling layer (28) is also a layer of Ru of thickness between approximately 7 and 8 angstroms with 7.5 angstroms being preferred. If the first coupling layer is a layer of Rh, then the second coupling layer is also a layer of Rh of a thickness between 4 and 6 angstroms with 5 angstroms being preferred. If the second coupling layer is Ru, the biasing layer (25) is a layer of CoFe of thickness between approximately 15 and 30 angstroms with 15 angstroms being preferred. If the second coupling layer is Rh, the biasing layer (25) is a layer of CoFe of thickness between approximately 25 and 30 angstroms with 28 angstroms being preferred. It is to be noted that the thicker biasing layer (25) formed in conjunction with the Rh coupling layer produces a greater pinning field in the sensor.

The synthetic exchange biased configuration (26) is then pinned by a second pinning layer, which is an antiferromagnetic layer of MnPt (25) of thickness between approximately 80 and 100 angstroms with 100 angstroms being preferred (note, if any of the other antiferromagnetic materials mentioned above have been used to form the first pinning layer, that same material can also be used here to form the second pinning layer). A conducting lead layer (20) is deposited over the MnPt layer (25) in a lead overlay (LOL) configuration. The lead layer is typically a Ta/Au/Ta trilayer of thickness between approximately 200 and 400 angstroms.

2) Annealing Process

The GMR sensor configuration thus formed is then given a pinned layer annealing to fix the magnetization of both synthetic pinned layers (26) & (30), which are, respectively, the antiferromagnetic pinned layer and the synthetic exchange biased configuration. The anneal consists of a 5 hour 280° C. anneal in an external magnetic field of approximately 10 kOe (kilo-oersteds) to set both pinned layers in the transverse direction (perpendicular to the air-bearing surface). The resulting magnetization vectors are shown as circles (53&57) representing magnetizations out of the plane, and circles with interior crosses (51&55) representing magnetizations into the plane. M1 and M2 are the labels representing the magnetizations of the free and biasing layers respectively. It is found by experiment that the configuration described above, under the anneal to which it is subjected as is also described above, has the advantageous properties of a high pinning field that is more than 1000 Oe, as well as an effective trackwidth of less than 0.15 microns subsequent to the patterning that will now be described. A significant advantage of the transverse directions of both the free and pinned layers is that there is a plateau of very little relative rotation of their magnetizations under small external magnetic fields. This plateau is particularly important in the region of the free layer directly beneath the biasing layer in that it leads to extremely small signals being produced by this portion of the free layer. Since unwanted side reading is a direct result of signals emanating from the extreme lateral portions of the free layer, this diminution of signals from that portion is directly responsible for the narrow effective trackwidth. Another important advantage of the transverse directions of both the free and pinned layers is that it is unnecessary to rotate the free layer magnetization with a second anneal after fixing the magnetization of the pinned layer. This allows the use of antiferromagnetic pinning layers of the same high blocking temperature material to be used to pin both the synthetic pinned layer and the synthetic exchange biased free layer. In turn, this allows high external fields to be used to fix the pinning field, which increases the efficacy of the biasing layer and reduces the effective trackwidth of the sensor. It has also been demonstrated that the high pinning fields thus obtained (exceeding 1000 Oe) eliminate the need for current shunting of the sensor current, which permits the use of thinner conducting lead layers and provides a more advantageous topology.

3) Patterning Process

Figure 4B:
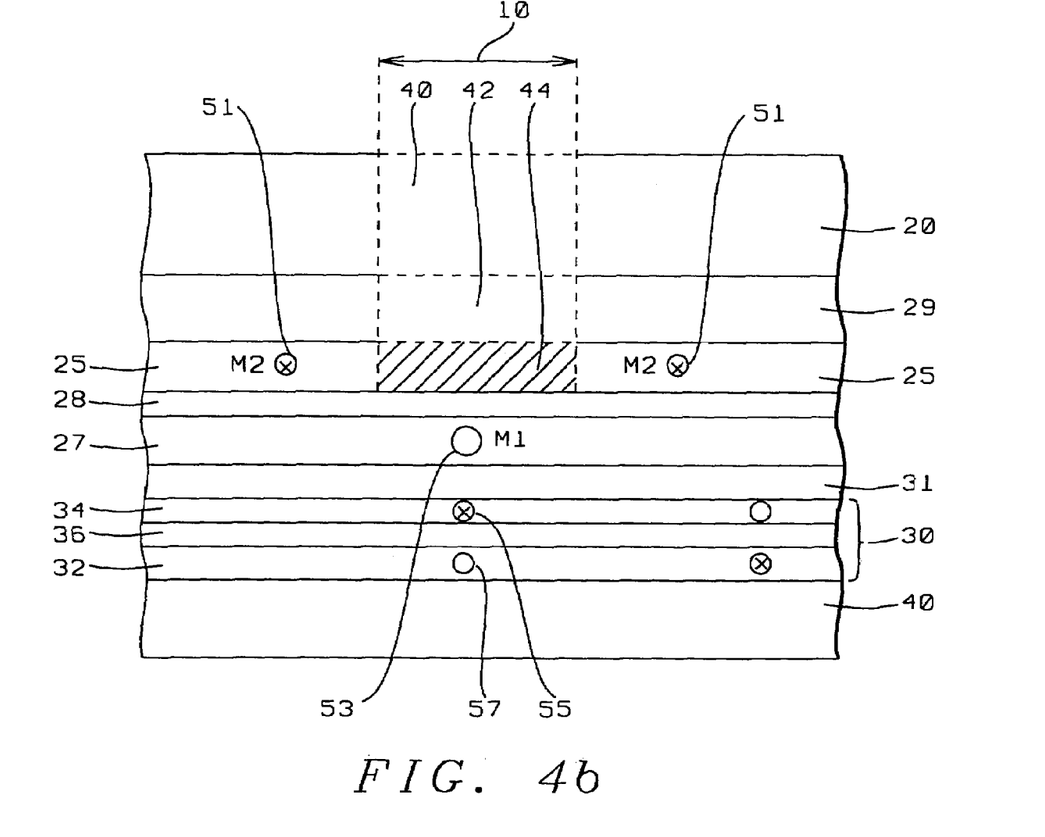
FIG. 4b is the sensor stack of FIG. 4a subsequent to patterning.

Referring now to FIG. 4b, there is shown a schematic diagram illustrating the process by which a physical trackwidth (10) of approximately 0.1 microns is formed in the sensor of FIG. 4a by patterning the lead and pinning layers to form the patterned exchange structure. Patterning is done by sequentially removing the entire thickness of a lateral portion of the lead layer ((40) shown in dashed outline) and the entire thickness of the MnPt pinning layer beneath it ((42) shown in dashed outline) by use of a reactive ion etch (RIE) or an ion beam etch (IBE). Removal of these two layers exposes the CoFe biasing layer (42), the portion of which is exposed ((44) shown shaded) being then effectively removed by an oxidation process, which converts it to non-magnetic CoFeO. In this process, the antiferromagnetically coupling layer (28) of Ru (or Rh) acts as an oxidation barrier to prevent the oxidation from extending downward to the ferromagnetic free layer (27) and adversely affecting it. The exposed surface of the coupling layer (28) is thereby itself oxidized at the termination of the process.

Third Preferred Embodiment

Figure 5A:
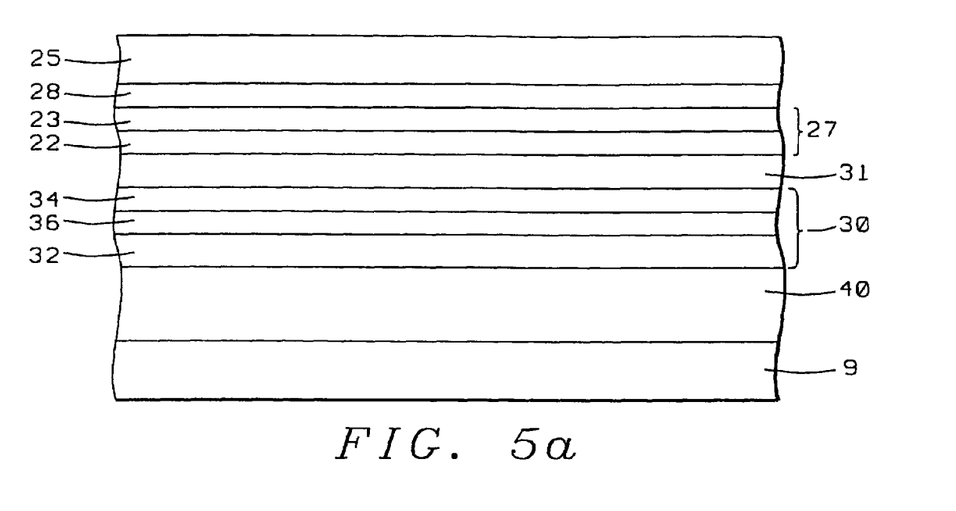
FIG. 5a is a schematic, ABS view, cross-sectional diagram of a partially formed synthetic exchange biased GMR sensor stack formed in accord with a third embodiment of the present invention. In this embodiment the transverse magnetizations of each lateral end of the exchange biased free layer are antiparallel to each other and each is also antiparallel to the transverse magnetizations of the biasing layers that overlay them.

Referring next to FIG. 5a, there is shown a schematic cross-sectional view of the air bearing surface (ABS) of a partially fabricated synthetic exchange transversely biased GMR sensor, before the antiparallel magnetization of its biasing layer and before deposition of a conducting lead layer and final patterning, fabricated in accord with the objects of a third embodiment of the present invention and having the properties and advantages of said embodiment. In this embodiment the transverse magnetizations of the pinning layer and free layer are antiparallel to each other at the opposite ends of the sensor where they are beneath the conducting lead layers. This configuration has been shown to have two advantages: 1) prevention of the bias point shift at the center active region of the free layer and 2) minimization of side reading at both sides of the sensor element.

Figure 5B:
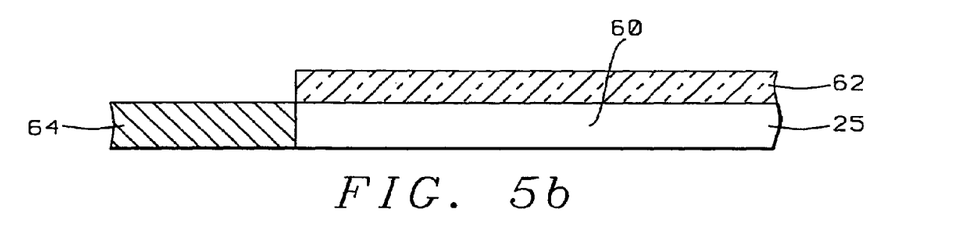
FIGS. 5b–5e show the detailed processes by which the sensor stack of 5a is patterned and magnetized.
Figure 5C:
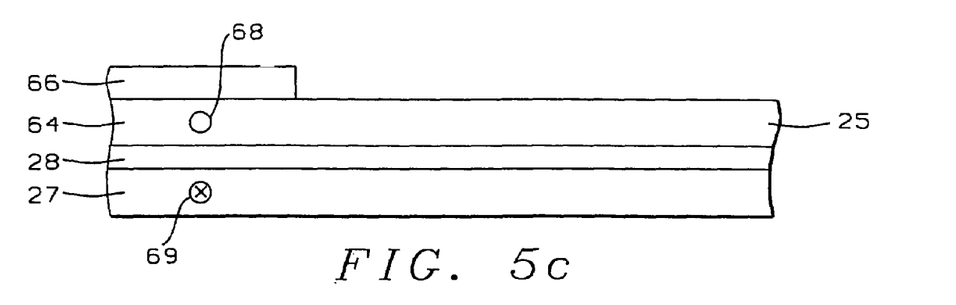
Figure 5D:
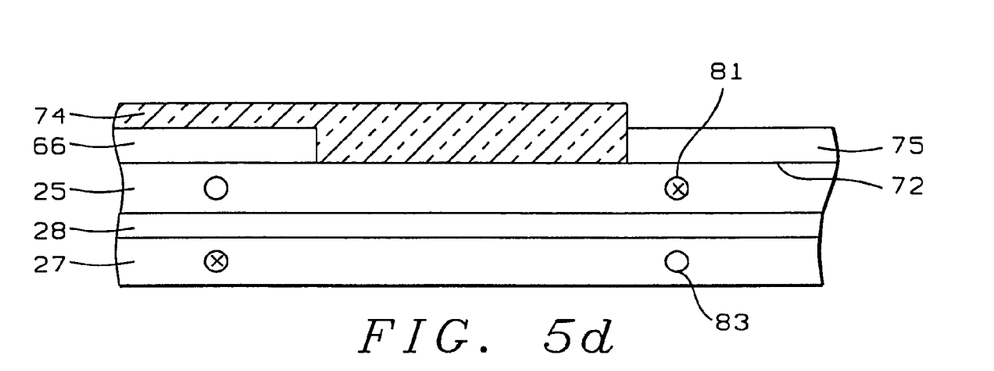

The device is fabricated in a sequence of four steps: 1) depositing the sensor layers up to and including the exchange biasing layer (shown in FIG. 5a); 2) separately magnetizing both lateral ends of the exchange biasing layer in opposite transverse directions using a two-step patterning and annealing sequence (shown in FIGS. 5b and 5c); 3) depositing conducting lead layers (shown in FIG. 5d); 4) patterning (FIG. 5d).

1) Deposition Process

Referring to FIG. 5a and looking vertically upward, there is first seen deposited a seed layer (9), which is typically a layer of NiCr deposited to a thickness of between approximately 50 and 60 angstroms. On this seed layer is then deposited a first antiferromagnetic layer (40) to serve as a pinning layer. Typically this pinning layer is a layer of MnPt deposited to a thickness of between approximately 100 and 150 angstroms, but other antiferromagnetic materials such as NiMn, PdPtMn, FeMn or IrMn can be used. On the first pinning layer there is then formed a synthetic antiferromagnetic pinned layer (30), which is an antiferromagnetically coupled trilayer comprising a first ferromagnetic layer (32), a first non-magnetic antiferromagnetically coupling layer (36) formed on (32) and a second ferromagnetic layer (34) formed on the coupling layer. The ferromagnetic layers are typically layers of CoFe, with the first ferromagnetic layer having a thickness of between approximately 15 and 20 angstroms with 15 angstroms being preferred and the second ferromagnetic layer having a thickness of between approximately 20 and 25 angstroms with 20 angstroms being preferred. The first non-magnetic antiferromagnetically coupling layer, which can be a layer of Ru, is formed to a thickness of between approximately 7 and 9 angstroms with 7.5 angstroms being preferred. Alternatively, the first coupling layer can be a layer of Rh, formed to a thickness of between 4 and 6 angstroms with 5 angstroms being preferred. In either case, the layer is formed of a material and to a thickness that will cause the two ferromagnetic layers to align their magnetizations in an antiparallel direction upon annealing. On the synthetic pinned layer there is then formed a non-magnetic spacer layer (31), which separates the pinned and free layers. This spacer layer is typically a layer of Cu, which is formed to a thickness of between approximately 15 and 22 angstroms with 18 angstroms being preferred. The free layer (27), which in this preferred embodiment is a ferromagnetic bilayer of CoFe (22) and NiFe (23), is then formed on the spacer layer, wherein the CoFe layer has a thickness of between approximately 5 and 15 with 10 angstroms being preferred and the NiFe layer has a thickness of between approximately 15 and 30 angstroms with 20 angstroms being preferred. The free layer is then antiferromagnetically exchange coupled across a second non-magnetic coupling layer (28) to a ferromagnetic biasing layer (25), forming, thereby, the synthetic antiferromagnetic exchange biased configuration (26). If the first non-magnetic coupling layer (36) is a layer of Ru, then the second non-magnetic coupling layer (28) is also a layer of Ru of thickness between approximately 7 and 8 angstroms with 7.5 angstroms being preferred. If the first coupling layer is a layer of Rh, then the second coupling layer is also a layer of Rh of a thickness between 4 and 6 angstroms with 5 angstroms being preferred. If the second coupling layer is Ru, the biasing layer (25) is a layer of CoFe of thickness between approximately 15 and 30 angstroms with 15 angstroms being preferred. If the second coupling layer is Rh, the biasing layer (25) is a layer of CoFe of thickness between approximately 25 and 30 angstroms with 28 angstroms being preferred. It is to be noted that the thicker biasing layer (25) formed in conjunction with the Rh coupling layer produces a greater pinning field in the sensor. At this point in the fabrication process the magnetization of the pinned layer can be set by an anneal in the same manner as in the previous embodiments. A 5 hour anneal in a 10 kOe magnetic field at a temperature of 280° C. is preferred.

Referring now to FIG. 5b, there is shown an upper portion of the structure of FIG. 5a wherein a lateral portion (60) of the ferromagnetic biasing layer (25) has been covered by a layer of etch resistant material (62) (such as photoresist), leaving the remaining portion (shown shaded) of the biasing layer uncovered (64). This uncovered portion is then cleaned by a sputter etch process.

Referring next to FIG. 5c, there is shown the cleaned portion (64) refilled with the same ferromagnetic material of the biasing layer and covered by an additional layer of antiferromagnetic material (66), such as a layer of IrMn deposited to a thickness 0 f between approximately 35 and 55 angstroms with 40 angstroms being preferred, to act as a pinning layer. During this deposition process, the fabrication thus produced is annealed in a first transverse magnetic field in a first transverse direction to fix the direction of the magnetizations in the antiferromagnetic coupling between the portion of the biasing layer (64), whose magnetization is shown as a circle (68), and the corresponding portion of the free layer (27) beneath it, whose antiparallel magnetization is shown as a circle with a cross (69). The first anneal is for between approximately 30 and 60 minutes but where approximately 30 minutes is preferred, at a temperature of between approximately 250° C. and 280° C., but where 250° C. is preferred and with a magnetic field of between approximately 250 and 500 Oe but where 250 Oe is preferred. The antiferromagnetic layer (66) pins the biasing layer in this process.

Referring next to FIG. 5d, there is shown the fabrication of FIG. 5c, wherein the surface of the opposite lateral portion (72) of the biasing layer is now exposed, while the remainder of the layer, which has already been magnetized, is covered by a resistant layer (74), such as a layer of photoresist. In a similar fashion to that described in FIG. 5c, the portion (72) is cleaned and covered with additional biasing material and, over it, a layer of antiferromagnetic pinning material (75) such as IrMn is formed in a manner identical to that described in FIG. 5c. During the deposition process a second external magnetic field in the opposite direction to that used in the process of FIG. 5c is applied and the biasing layer portion (72) is thereby magnetized in the direction of that magnetic field (circle with a cross (81)) and the free layer beneath it (27) is oppositely magnetized (circle (83)). The second anneal, like the first, is for between approximately 30 and 60 minutes but where approximately 30 minutes is preferred, at a temperature of between approximately 250° C. and 280° C., but where 250° C. is preferred and with a magnetic field of between approximately 250 and 500 Oe but where 250 Oe is preferred. The deposited antiferromagnetic layer (75) serves to pin the biasing layer by this process.

Figure 5E:
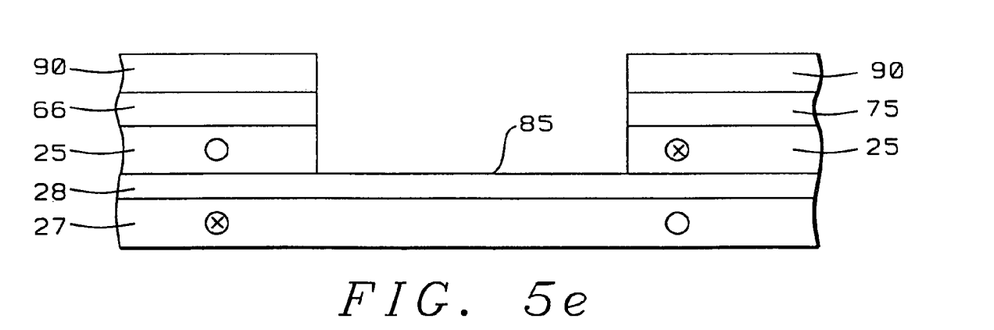

Referring now to FIG. 5e, there is shown the fabrication of FIG. 5d wherein a central portion (85) of the twice magnetized biasing layer is removed by an ion beam or chemical etching process to form a trackwidth of desired dimension. A conducting lead layer (90) has been formed over the two biasing layers. The lead layer is typically a Ta/Au/Ta trilayer of thickness between approximately 200 and 400 angstroms.

As is understood by a person skilled in the art, the preferred embodiments of the present invention are illustrative of the present invention rather than limiting of the present invention. Revisions and modifications may be made to methods, materials, structures and dimensions employed in fabricating a synthetic, patterned, longitudinally or transversely exchange biased GMR sensor with narrow effective trackwidth, while still providing a method for fabricating such a synthetic, patterned, longitudinally or transversely exchange biased GMR sensor with narrow effective trackwidth, in accord with the spirit and scope of the present invention as defined by the appended claims.

What is claimed is:

1. A method for fabricating a patterned, synthetic transversely exchange biased GMR sensor with narrow effective trackwidth comprising:
    providing a substrate;
    forming a seed layer on said substrate;
    forming a layer of antiferromagnetic material on the seed layer, said layer of antiferromagnetic material being a pinning layer;
    forming a synthetic antiferromagnetic pinned layer on said first antiferromagnetic pinning layer;
    forming a non-magnetic spacer layer on said pinned layer;
    forming a ferromagnetic free layer on said non-magnetic spacer layer;

forming a non-magnetic antiferromagnetically coupling layer on said ferromagnetic free layer;

forming a ferromagnetic, transversely biasing layer on said coupling layer;

magnetizing and pinning the synthetic antiferromagnetic pinned layer with the first antiferromagnetic pinning layer;

magnetizing and antiferromagnetically pinning with a first patterned antiferromagnetic pinning layer a first portion of said biasing layer in a first transverse direction using a first patterning and magnetizing process whereby said first portion is magnetized and exchange coupled to a first portion of the ferromagnetic free layer;

magnetizing and antiferromagnetically pinning with a second patterned antiferromagnetic pinning layer a second portion of said biasing layer in a second transverse direction using a second patterning and magnetizing process whereby said second portion is magnetized in an opposite direction to said first portion and exchange coupled to a second portion of the ferromagnetic free layer removing, by an etching process, a central portion of said biasing layer which is situated between said pinned and magnetized first and second portions to form a track-width region of the sensor;

forming a conductive lead layer over each of the antiferromagnetically pinned first and second portions of the transversely biasing layer.

2. The method of claim 1 wherein the first patterning and magnetizing process comprises:

forming a layer of photoresist material over the biasing layer;

removing a portion of said photoresist material to expose a portion of the biasing layer extending longitudinally from one lateral edge of the layer, less than half the longitudinal width of the layer;

cleaning said exposed portion with an etching process;

depositing additional ferromagnetic material to restore any ferromagnetic material removed by the etching process;

forming a layer of antiferromagnetic material over said exposed portion to serve as a pinning layer;

annealing the structure so formed at a first annealing temperature for a first annealing time in a first transverse magnetic field directed in a first direction;

removing the remaining photoresist.

3. The process of claim 2 wherein the layer of antiferromagnetic material is a layer of IrMn deposited to a thickness of between approximately 35 and 55 angstroms.

4. The process of claim 3 wherein the first anneal is for between approximately 30 and 60 minutes at a temperature of between approximately 250° C. and 280° C., and with a magnetic field of between approximately 250 and 500 Oe.

5. The method of claim 1 wherein the second patterning and magnetizing process comprises:

forming a layer of photoresist material over the biasing layer;

removing a portion of said photoresist material having the same approximate dimensions as the layer removed in the first patterning and magnetizing process, but symmetrically disposed on the opposite lateral end of the biasing layer;

cleaning said exposed portion with an etching process;

depositing additional ferromagnetic material to restore any ferromagnetic material removed by the etching process;

forming a layer of antiferromagnetic material over said exposed portion to serve as a pinning layer;

annealing the structure so formed at a second annealing temperature for a second annealing time in a second transverse magnetic field oppositely directed to the first transverse magnetic field of the first patterning and magnetizing process;

removing any remaining photoresist from the structure so formed.

6. The process of claim 5 wherein the layer of antiferromagnetic material is a layer of IrMn deposited to a thickness of between approximately 35 and 55 angstroms.

7. The process of claim 6 wherein the second anneal is for between approximately 30 and 60 minutes at a temperature of between approximately 250° C. and 280° C., and with a magnetic field of between approximately 250 and 500 Oe.

* * * * *